US012633341B2

(12) United States Patent
Liu et al.

(10) Patent No.: US 12,633,341 B2
(45) Date of Patent: May 19, 2026

(54) COMPUTATION IN MEMORY SYSTEM

(71) Applicant: NATIONAL TAIWAN UNIVERSITY, Taipei (TW)

(72) Inventors: Tsung-Te Liu, Taipei (TW); Chun-Yen Yao, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 109 days.

(21) Appl. No.: 18/776,264

(22) Filed: Jul. 18, 2024

(65) Prior Publication Data

US 2025/0226028 A1 Jul. 10, 2025

(30) Foreign Application Priority Data

Jan. 8, 2024 (TW) ................................. 113100802

(51) Int. Cl.
| | |
|---|---|
| *G11C 11/419* | (2006.01) |
| *G11C 11/412* | (2006.01) |
| *H03K 19/20* | (2006.01) |
| *H03M 1/38* | (2006.01) |

(52) U.S. Cl.
CPC .......... *G11C 11/419* (2013.01); *G11C 11/412* (2013.01); *H03K 19/20* (2013.01); *H03M 1/38* (2013.01)

(58) Field of Classification Search
CPC ..... G11C 11/419; G11C 11/412; H03K 19/20; H03M 1/38
USPC ........................................................ 365/154
See application file for complete search history.

(56) References Cited

U.S. PATENT DOCUMENTS

| | | | |
|---|---|---|---|
| 7,646,648 | B2 | 1/2010 | Arsovski |
| 2020/0105337 | A1 | 4/2020 | Chen et al. |
| 2021/0158854 | A1 | 5/2021 | Sinangil |
| 2022/0262424 | A1 | 8/2022 | Sinangil |
| 2023/0078079 | A1 | 3/2023 | Atallah et al. |
| 2023/0186979 | A1* | 6/2023 | He ........................... G11C 5/06 |
| | | | 365/185.2 |

FOREIGN PATENT DOCUMENTS

| | | |
|---|---|---|
| CN | 111863071 A | 10/2020 |
| CN | 115482847 A | 12/2022 |
| CN | 108268423 B | 10/2023 |
| TW | I811450 B | 8/2023 |

OTHER PUBLICATIONS

Chun-Yen Yao, et al., "A Fully Bit-Flexible Computation in Memory Macro Using Multi-Functional Computing Bit Cell and Embedded Input Sparsity Sensing", IEEE Journal of Solid-State Circuits, Jan. 9, 2023, p. 1487-1495, vol. 58, Issue 5, IEEE, U.S.A.

* cited by examiner

*Primary Examiner* — Fernando Hidalgo
(74) *Attorney, Agent, or Firm* — CKC & Partners Co., LLC

(57) ABSTRACT

A computation in memory system includes a plurality of block pairs. Each of the plurality of block pairs includes two types of blocks, and each of the two types of blocks includes a plurality of operation units. Each of the plurality of operation units includes a static random access memory, an AND gate, a NOR gate and a capacitor. The capacitor is electrically connected to the NOR gate, the NOR gate is electrically connected to the AND gate, the AND gate is electrically connected to the static random access memory, and the static random access memory performs memory reading and writing functions.

9 Claims, 5 Drawing Sheets

120

500

COMPUTATION IN MEMORY SYSTEM

CROSS-REFERENCE TO RELATED APPLICATION

This application claims priority to Taiwan Application Serial Number 113100802, filed Jan. 8, 2024, which is herein incorporated by reference in its entirety.

BACKGROUND

Field of Invention

The present invention relates to memory systems. More particularly, the present invention relates to computation in memory systems.

Description of Related Art

In the conventional arts, the bit-level in-memory operations are used to implement the full bit flexibility, but they are trapped in a considerable circuit area of the analog-to-digital (A/D) conversion and reference voltage or current circuits. In addition, during the A/D conversion, the considerable energy consumption occurs, which affects the energy efficiency.

In view of the foregoing, there still exist some problems that await further improvement. However, those skilled in the art sought vainly for a solution. Accordingly, there is an urgent need in the related field to improve the energy efficiency.

SUMMARY

The present disclosure provides computation in memory systems, to solve or circumvent aforesaid problems and disadvantages in the related art.

An embodiment of the present disclosure is related to a computation in memory system includes a plurality of block pairs, where each of the plurality of block pairs comprises two types of blocks, each of the two types of blocks comprises a plurality of operation units, each of the plurality of operation units comprises a static random access memory (SRAM), an AND gate, a NOR gate and a capacitor, the capacitor is electrically connected to the NOR gate, the NOR gate is electrically connected to the AND gate, the AND gate is electrically connected to the SRAM, and the SRAM performs a memory reading and writing function.

In some embodiments of the present disclosure, each of the two types of blocks further comprises a reset switch, two ends of the reset switch are electrically connected to the capacitor and a ground terminal respectively, and the SRAM performs the memory reading and writing function when the reset switch is turned on.

In some embodiments of the present disclosure, two input terminals of the AND gate are electrically connected to the SRAM and a read-word-line respectively, a control signal is applied to the read-word-line, and the reset switch is turned off, so that the AND gate and the NOR gate perform a bit-level multiply-accumulate operation on data of the SRAM.

In some embodiments of the present disclosure, two ends of the capacitor are electrically connected to the reset switch and an output terminal of the NOR gate, and two input terminals of the NOR gate are electrically connected to an output terminal of the AND gate and a control line respectively, a control signal is applied to the control line, the reset switch is turned off, so that the NOR gate and the capacitor perform a reference voltage generation.

In some embodiments of the present disclosure, the computation in memory system further includes a plurality of comparators and a plurality of successive-approximation register (SAR) analog-to-digital (A/D) operation controllers. Two input terminals of each of the comparators are electrically connected to the two types of blocks respectively. The SAR A/D operation controllers are electrically connected to the block pairs respectively, where an output terminal of each of the comparators is electrically connected to a corresponding SAR A/D operation controller of the SAR A/D operation controllers.

In some embodiments of the present disclosure, the corresponding SAR A/D operation controller repeatedly follows a comparison result from the output terminal of the comparator to successively adjust one block of the two types of blocks for an A/D conversion, where a voltage of the one block is higher than a voltage of another block of the two types of blocks.

In some embodiments of the present disclosure, the computation in memory system further includes a plurality of distributors and an input buffer. The distributors electrically connected to the operation units respectively. The input buffer is electrically connected to the distributors.

In some embodiments of the present disclosure, the computation in memory system further includes a sparsity sensor. The sparsity sensor is electrically connected to the input buffer and the SAR A/D operation controllers, the sparsity sensor detects a sparsity of bit-level inputs in the input buffer, so that the corresponding SAR A/D operation controller scales a dynamic range of the A/D conversion.

In some embodiments of the present disclosure, the computation in memory system further includes an output buffer and an aggregator. The output buffer is electrically connected to the SAR A/D operation controllers. The aggregator is electrically connected to the output buffer.

In view of the above, through the computation in memory system of the present disclosure, not only the area usage efficiency is greatly improved, but also the energy usage efficiency is greatly improved.

Many of the attendant features will be more readily appreciated, as the same becomes better understood by reference to the following detailed description considered in connection with the accompanying drawings.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
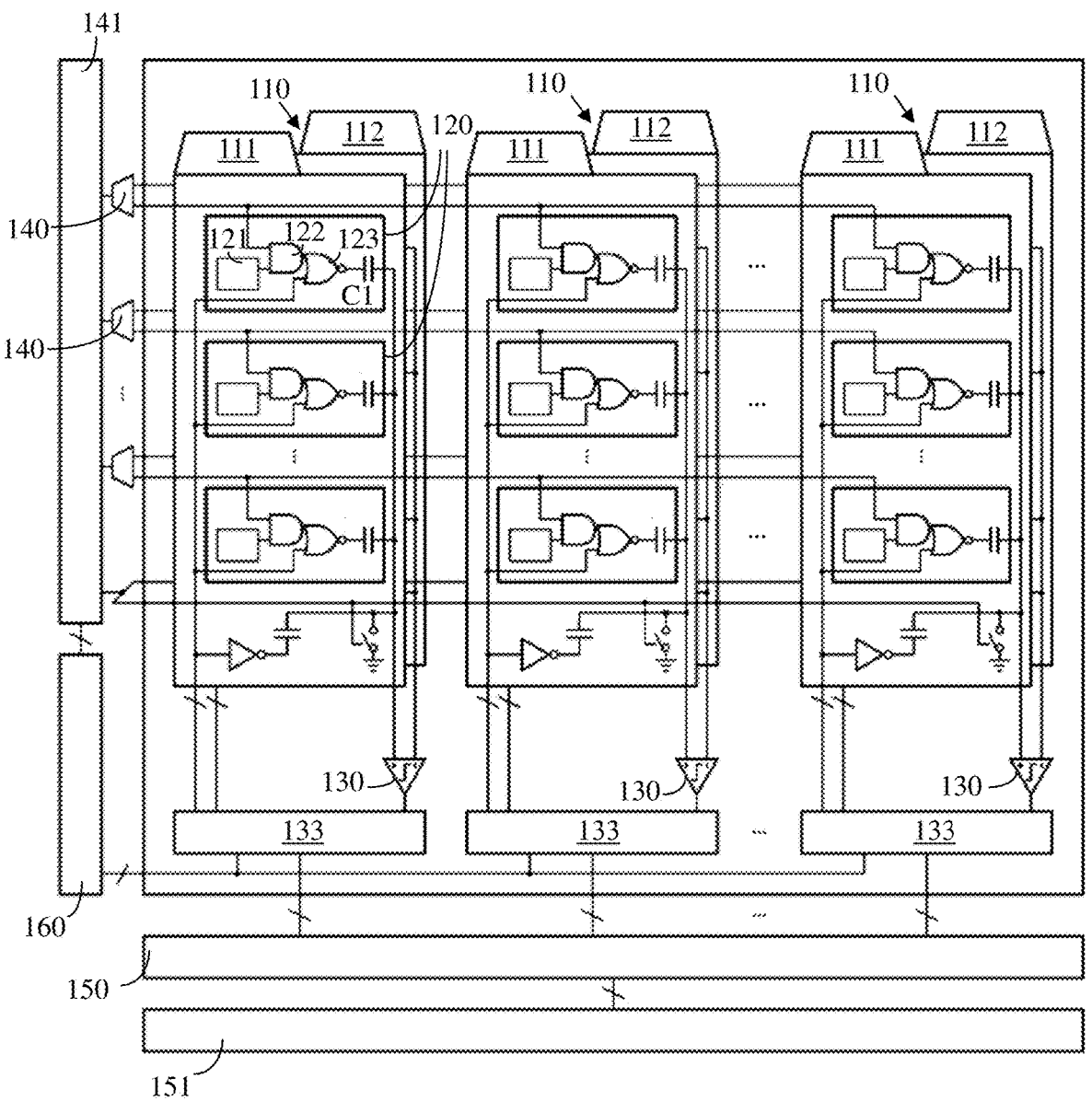
FIG. 1 is a block diagram of a computation in memory system according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

Referring to FIG. 1. In one aspect, the present disclosure is directed to a computation in memory (CIM) system 100. The CIM system 100 may be easily integrated into a memory circuit and may be applicable or readily adaptable to all technologies. The CIM system 100 has advantages. Herewith the CIM system 100 is described below with FIG. 1.

The subject disclosure provides the CIM system 100 in accordance with the subject technology. Various aspects of the present technology are described with reference to the drawings. In the following description, for purposes of explanation, numerous specific details are set forth in order to provide a thorough understanding of one or more aspects. It can be evident, however, that the present technology can be practiced without these specific details. In other instances, well-known structures and devices are shown in block diagram form in order to facilitate describing these aspects. The word "exemplary" is used herein to mean "serving as an example, instance, or illustration." Any embodiment described herein as "exemplary" is not necessarily to be construed as preferred or advantageous over other embodiments.

FIG. 1 is a block diagram of the CIM system 100 according to some embodiments of the present disclosure. As shown in FIG. 1, the CIM system 100 includes block pairs 110. Each block pair 110 includes two types of blocks 111 and 112. The internal circuits of the two types of blocks 111 and 112 are the same or similar. Each block (taking the block 111 as an example) of the two types of blocks 111 and 112 includes multiple operation units 120. Each operation unit 120 includes a SRAM 121, an AND gate 122, a NOR gate 123 and a capacitor C1. In structure, the capacitor C1 is electrically connected to the NOR gate 123, the NOR gate 123 is electrically connected to the AND gate 122, and the AND gate 122 is electrically connected to the SRAM 121. In use, the SRAM 121 performs the memory reading and writing function. It should be noted that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In some embodiments of the present disclosure, the CIM system 100 further includes comparators 130 and SAR A/D operation controllers 133. In structure, two input terminals of each comparator 130 are electrically connected to two types of blocks 111 and 112 respectively. The SAR A/D operation controllers 133 are electrically connected to multiple block pairs 110 respectively, and the output terminal of each comparator 130 is electrically connected to the corresponding SAR A/D operation controller 133. In practice, for example, the SAR A/D operation controller 133 may include a SAR logic circuit and an asynchronous pulse generator.

In some embodiments of the present disclosure, the CIM system 100 further includes distributors 140 and an input buffer 141. In structure, the distributors 140 are electrically connected to the operation units 120, and the input buffer 141 is electrically connected to the distributors 140. In use, the input buffer 141 caches the input data, and the distributors 140 distribute the input data to the operation units 120 correspondingly.

In some embodiments of the present disclosure, the CIM system 100 further includes an output buffer 150 and an aggregator 151. In structure, the output buffer 150 is electrically connected to the multiple SAR A/D operation controllers 133, and the aggregator 151 is electrically connected to the output buffer 150. In use, the output buffer 150 caches digital signals output by the SAR A/D operation controllers 133, and the aggregator 151 integrates the digital signals into digital data.

Figure 2:
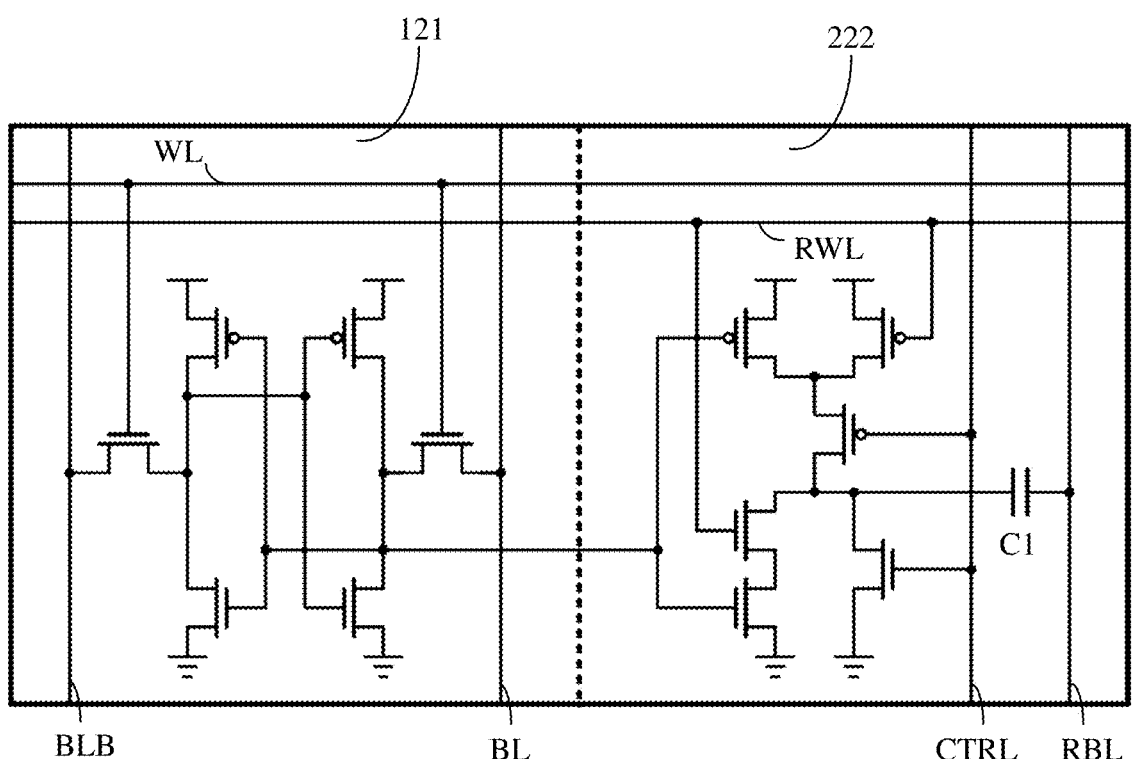
FIG. 2 is a circuit diagram of an operation unit of FIG. 1.

FIG. 2 is a circuit diagram of an operation unit of FIG. 1. As shown in FIG. 2, the SRAM 121 can be a 6T SRAM. In structure, the SRAM 121 is electrically connected to a word line WL, a bit line BL and a complementary bit line BLB. In use, the SRAM 121 can execute the memory reading and writing function(s) through the word line WL, the bit line BL and/or the complementary bit line BLB. The circuit 222 may include an AND gate 122, a NOR gate 123 and a capacitor C1. In structure, the circuit 222 is electrically connected to the read-word-line RWL, the control line CTRL, and the read-bit-line RBL. In practice, for example, the operation unit 120 can be a multi-function operation bit, which can be adapted to the memory reading and writing function, the bit-level multiply-accumulate operation, the reference voltage generation and the A/D conversion with capacitor switching, so that the CIM system 100 achieves the maximum area utilization efficiency and the hardware flexibility.

Figure 3:
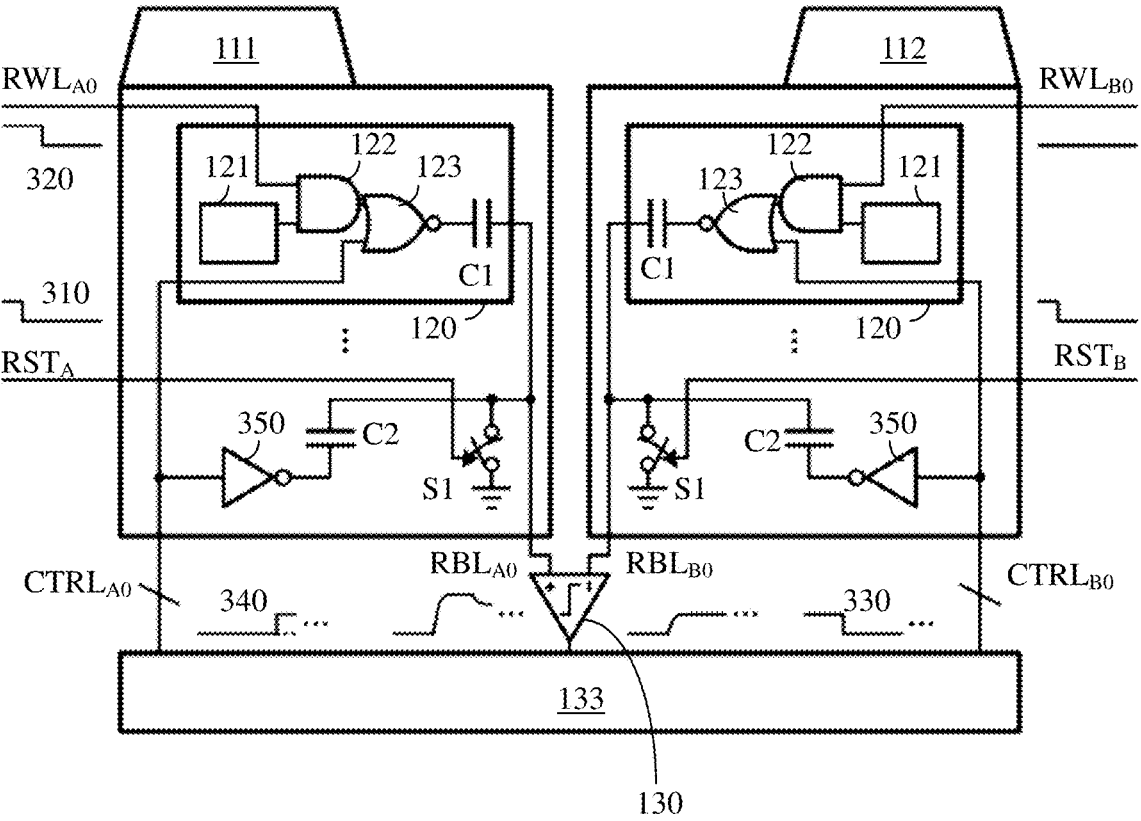
FIG. 3 is a block diagram of a partial circuit in the computation in memory system of FIG. 1.
Figure 4:
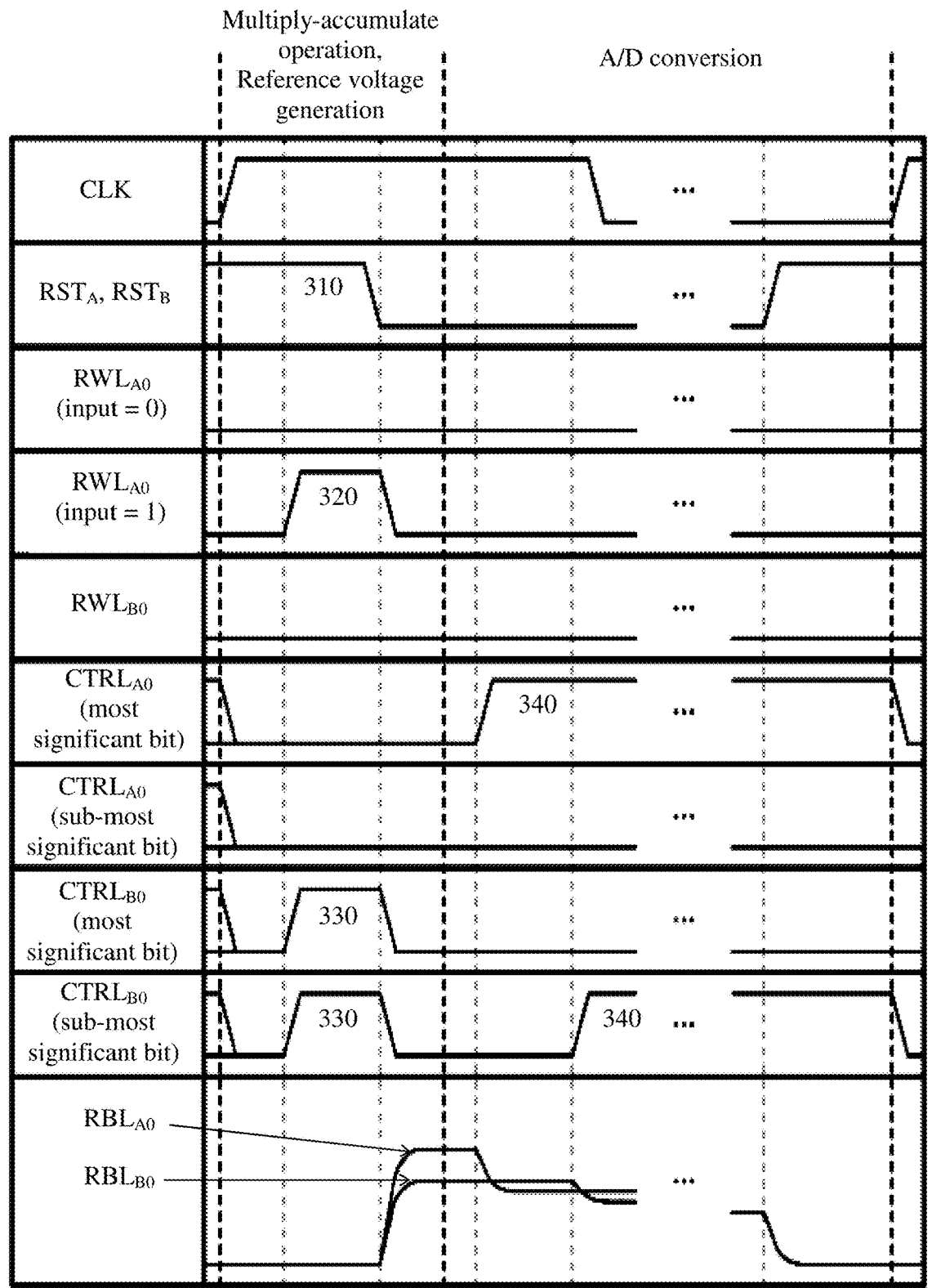
FIG. 4 is a timing diagram of the partial circuit in FIG. 3 during operation.
Figure 5:
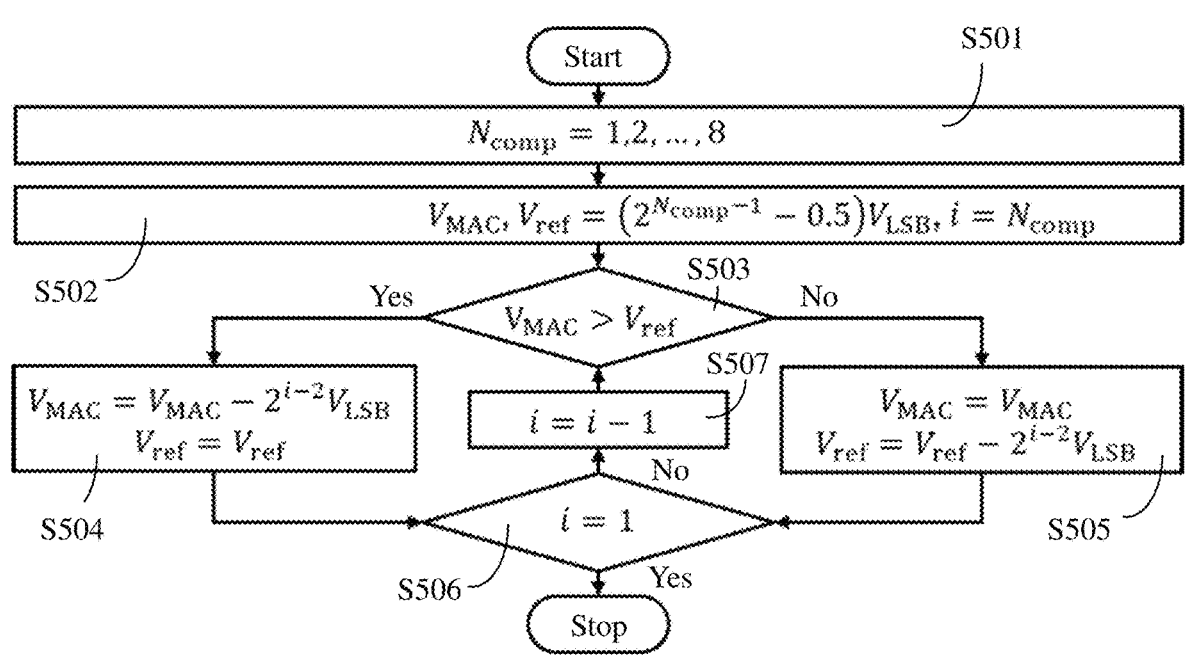
FIG. 5 is a flow chart of an operation method of the computation in memory system according to some embodiments of the present disclosure.

For a more complete understanding of the above-mentioned multi-function operation bit, referring FIG. 3 and FIG. 4, FIG. 3 is a block diagram of a partial circuit in the CIM system 100 of FIG. 1, and FIG. 4 is a timing diagram of the partial circuit in FIG. 3 during operation.

Regarding the above memory reading and writing function, in some embodiments of the present disclosure, the block 111 is taken as an example. The block 111 includes an operation unit 120 and a reset switch S1. In structure, both ends of reset switch S1 are electrically connected to capacitor C1 and the ground terminal respectively. In use, when the reset switch S1 is turned on, the SRAM 121 is used to perform the memory reading and writing function. In practice, for example, the read and write signals are given through the word line WL as shown in FIG. 2, so that the SRAM 121 can execute the memory reading and writing function.

Regarding the above bit-level multiply-accumulate operation, in some embodiments of the present disclosure, taking the block 111 as an example, the two input terminals of AND gate 122 are electrically connected to SRAM 121 and read-word-line $RWL_{A0}$ respectively. In use, a shutdown signal is applied to the reset line $RST_A$ (signal status 310), the reset switch S1 is turned off, a control signal is applied to the read-word-line $RWL_{A0}$ (signal status 320), so that the AND gate 122 and the NOR gate 123 perform the bit-level multiply-accumulate operation on data of the SRAM 121.

Regarding the above reference voltage generation, in some embodiments of the present disclosure, the block 111 performs the bit-level multiply-accumulate operation, and the block 112 can serve as a reference voltage generation circuit. Taking the block 112 as an example, the two ends of the capacitor C1 are electrically connected to the reset switch S1, the output terminal of the NOR gate 123, and the two input terminals of the NOR gate 123 are electrically connected to the output terminal of the AND gate 122 and the control line $CTRL_{B0}$ respectively. In use, a shutdown signal is applied to the reset line $RST_B$ is given (signal status 310), the reset switch S1 is turned off, and a control signal is applied to the control line $CTRL_{B0}$ (signal status 330), so that the NOR gate 123 and the capacitor C1 in the block 112 can perform the reference voltage generation.

In addition, in FIG. 3, one end of the reset switch S1 is electrically connected to the ground terminal, another end of the reset switch S1 is electrically connected to one end of the capacitor C2, and another end of the capacitor C2 is electrically connected to the output terminal of the inverter 350. The capacitance of capacitor C2 is half the capacitance of capacitor C1. Taking the block 111 as an example, the another end of reset switch S1 is electrically connected to an input terminal of capacitor C1 and the comparator 130 through the read-bit-line $RBL_{A0}$, and the SAR A/D operation controller 133 is electrically connected to the input terminal of the NOR gate 123 and the input terminal of the inverter 350 through the control line $CTRL_{A0}$. Similarly, taking the block 112 as an example, the another end of the reset switch S1 is electrically connected to the capacitor C1 and another input terminal of the comparator 130 through the read-bit-line $RBL_{B0}$, and the SAR A/D operation controller 133 is electrically connected to the input terminal of the NOR gate 123 and the input terminal of the inverter 350 through the control line $CTRL_{B0}$.

Regarding the above-mentioned A/D conversion with capacitor switching, in some embodiments of the present disclosure, the SAR A/D operation controller 133 repeatedly follows the comparison result from the output terminal of the comparator 130 to successively adjust one block of the two types of the blocks 111 and 112 for A/D conversion, in which a voltage of the aforesaid one block is higher than a voltage of another block of the two types of blocks 111 and 112. For example, when the multiply-accumulate operation voltage output by block 111 to the read-bit-line $RBL_{A0}$ is higher than the reference voltage output by the block 112 to the read-bit-line $RBL_{B0}$, the SAR A/D operation controller 133 decreases the multiplication and accumulation operation voltage output by the block 111 through the control line $CTRL_{A0}$ (signal status 340). The SAR A/D operation controller 133 again follows the comparison result from the output terminal of the comparator 130 to successively adjust one block having a higher voltage of the two types of the blocks 111 and 112 until the number of comparisons (e.g., a default number of comparisons) is completed. The SAR A/D operation controller 133 can record the corresponding digital signal based on the ranges of adjustments and/or the number of above adjustments.

Returning to FIG. 1, in some embodiments of the present disclosure, the CIM system 100 further includes a sparsity sensor 160. In structure, the sparsity sensor 160 is electrically connected to the input buffer 141 and the SAR A/D operation controllers 133. The sparsity sensor 160 detects the sparsity of the bit-level inputs in the input buffer 141, so that the corresponding SAR A/D operation controller 133 can scale the dynamic range of the A/D conversion. In view of above, an embedded input sparsity sensing and a self-adaptive dynamic range (DR) scaling scheme proposed by the present disclosure determines different dynamic ranges by detecting the sparsity of the input, thereby reducing the voltage comparisons and the switching times of capacitor C1 during operation in the CIM system 100, so as to minimize the energy-consuming A/D conversions in CIM.

For a more complete understanding of the above-mentioned embedded input sparsity sensing and a self-adaptive DR scaling scheme, referring FIG. 1 to FIG. 5, FIG. 5 is a flow chart of an operation method of the CIM system 100 according to some embodiments of the present disclosure.

In step S501, for example, the sparsity sensor 160 performs input sparsity sensing to detect that in the input buffer 141 the data number $N_{comp}$ of values ranging from 128 to 255 for input logic 1 is eight as the basis for the dynamic range. In step S502, the block 111 initially outputs the multiplication-accumulation voltage $V_{MAC}$, the block 112 initially outputs the reference voltage $V_{ref}$, $V_{LSB}$ is the unit voltage value, and the default number of comparisons i are preset to 8 times, which is equal to the total number of data numbers $N_{comp}$. In steps S503 to S507, the SAR A/D operation controller 133 repeatedly follows the comparison results of the output terminal of the comparator 130 to successively adjust one block having a higher voltage of the two types of the blocks 111 and 112 based on the dynamic range for A/D conversion accordingly.

In view of the above, through the CIM system 100 of the present disclosure, not only the area usage efficiency is greatly improved, but also the energy usage efficiency is greatly improved.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A computation in memory system, comprising:
a plurality of block pairs, wherein each of the plurality of block pairs comprises two types of blocks, each of the two types of blocks comprises a plurality of operation units, each of the plurality of operation units comprises a static random access memory (SRAM), an AND gate, a NOR gate and a capacitor, the capacitor is electrically connected to the NOR gate, the NOR gate is electrically connected to the AND gate, the AND gate is electrically connected to the SRAM, and the SRAM performs a memory reading and writing function.

2. The computation in memory system of claim 1, wherein each of the two types of blocks further comprises a reset switch, two ends of the reset switch are electrically connected to the capacitor and a ground terminal respectively, and the SRAM performs the memory reading and writing function in response to the reset switch being turned on.

3. The computation in memory system of claim 2, wherein two input terminals of the AND gate are electrically connected to the SRAM and a read-word-line respectively, in response to a control signal being applied to the read-word-line, and the reset switch being turned off, the AND gate and the NOR gate perform a bit-level multiply-accumulate operation on data of the SRAM.

4. The computation in memory system of claim 2, wherein two ends of the capacitor are electrically connected to the reset switch and an output terminal of the NOR gate, and two input terminals of the NOR gate are electrically connected to an output terminal of the AND gate and a control line respectively, in response to a control signal being applied to the control line and the reset switch being turned off, the NOR gate and the capacitor perform a reference voltage generation.

5. The computation in memory system of claim 1, further comprising:
a plurality of comparators, wherein two input terminals of each of the comparators are electrically connected to the two types of blocks respectively; and a plurality of successive-approximation register (SAR) analog-to-digital (A/D) operation controllers electrically connected to the block pairs respectively, wherein an output terminal of each of the comparators is electrically connected to a corresponding SAR A/D operation controller of the SAR A/D operation controllers.

6. The computation in memory system of claim 5, wherein the corresponding SAR A/D operation controller repeatedly follows a comparison result from the output terminal of the comparator to successively adjust one block of the two types of blocks for an A/D conversion, wherein a voltage of the one block is higher than a voltage of another block of the two types of blocks.

7. The computation in memory system of claim 6, further comprising:
a plurality of distributors electrically connected to the operation units respectively; and
an input buffer electrically connected to the distributors.

8. The computation in memory system of claim 7, further comprising:
a sparsity sensor electrically connected to the input buffer and the SAR A/D operation controllers, the sparsity sensor detects a sparsity of bit-level inputs in the input buffer, so that the corresponding SAR A/D operation controller scales a dynamic range of the A/D conversion.

9. The computation in memory system of claim 7, further comprising:
an output buffer electrically connected to the SAR A/D operation controllers; and
an aggregator electrically connected to the output buffer.

\* \* \* \* \*